United States Patent
Prianishnikov et al.

(10) Patent No.: US 6,812,795 B2
(45) Date of Patent: Nov. 2, 2004

(54) TRANSIMPEDANCE AMPLIFIER WITH FEEDBACK RESISTIVE NETWORK

(75) Inventors: Vladimir N. Prianishnikov, Sunnyvale, CA (US); Alexander V. Khaydarov, San Jose, CA (US); Oleg A. Kobildjanov, San Jose, CA (US)

(73) Assignee: O2Micro International Limited, Grand Cayman (KY)

( * ) Notice: Subject to any disclaimer, the term of this patent is extended or adjusted under 35 U.S.C. 154(b) by 0 days.

(21) Appl. No.: 10/364,229

(22) Filed: Feb. 11, 2003

(65) Prior Publication Data

US 2004/0155713 A1 Aug. 12, 2004

(51) Int. Cl.[7] .............................. H03F 3/08; H01J 40/14
(52) U.S. Cl. ...................... 330/308; 330/59; 250/214 A
(58) Field of Search ................. 330/5, 308; 250/214 A, 250/214 AG

(56) References Cited

U.S. PATENT DOCUMENTS

| | | | |
|---|---|---|---|
| 4,029,976 A | * 6/1977 | Fish et al. | 327/514 |
| 5,030,925 A | 7/1991 | Taylor | 330/308 |
| 5,343,160 A | 8/1994 | Taylor | 330/9 |
| 5,455,705 A | 10/1995 | Gusinov | 359/189 |
| 5,565,672 A | * 10/1996 | Siegel et al. | 330/59 |
| 5,973,314 A | * 10/1999 | Shodo | 250/214 A |
| 5,982,232 A | 11/1999 | Rogers | 330/69 |
| 6,114,913 A | 9/2000 | Entrikin | 330/308 |
| 6,246,284 B1 | * 6/2001 | Nemoto | 330/308 |

OTHER PUBLICATIONS

"InP/InGaAs Double–Heterojunction Bipolar Transistors for High–Speed Optical Receivers" by Eiichi Sano, Mikio Yoneyama, Shoji Yamahata, and Yutaka Matsuoka. From: IEE Transactions on Electron Devices, vol. 43, No. 11, Nov. 1996.

"High Speed, Low–Power Lightwave Communication ICs Using InP/InGaAs Double–Heterojunction Bipolar Transistors" by Eiichi, Kenji Kurishima, Hiroki Nakajima, and Shoji Yamahata. From: IEICE Trans. Electron., vol. E82–C, No. 11 Nov. 1999.

* cited by examiner

*Primary Examiner*—Khanh Van Nguyen
(74) *Attorney, Agent, or Firm*—Grossman, Tucker, Perreault & Pfleger, PLLC

(57) ABSTRACT

A transimpedance amplifier having a voltage amplifier and a feedback circuit coupled to an input terminal and an output terminal of the voltage amplifier. The feedback circuit includes an impedance element in parallel with a feedback resistive network. The feedback resistive network has a fixed effective resistance value. The feedback resistive network may have a first resistive element disposed between the input terminal of the voltage amplifier and a node, a second resistive element disposed between the output terminal of the voltage amplifier and the node, and a third resistive element disposed between the node and a ground terminal. Various systems utilizing a transimpedance amplifier consistent with the invention, including an optical communication system are also provided.

16 Claims, 3 Drawing Sheets

TRANSIMPEDANCE AMPLIFIER WITH FEEDBACK RESISTIVE NETWORK

FIELD OF THE INVENTION

The present invention relates to transimpedance amplifiers and in particular to a transimpedance amplifier having a feedback resistive network.

BACKGROUND OF THE INVENTION

Transimpedance amplifiers convert an input current signal into an output voltage signal. Transimpedance amplifiers may be utilized in a variety of systems and applications including an optical communication system. A transimpedance amplifier typically includes one feedback resistor coupled across an input terminal and output terminal of a voltage amplifier. The current signal applied to the voltage amplifier is passed substantially through the feedback resistor because of the high input impedance of the voltage amplifier. A voltage signal proportional to the input current is thus produced at the output of the voltage amplifier.

To achieve greater gain and sensitivity of the transimpedance amplifier, the resistance of the feedback resistor is typically increased. However, increasing the resistance of the feedback resistor has several drawbacks. First, the feedback resistor has an increased physical size which takes up more space in an environment where there is a premium on such space. Second, resistors manufactured utilizing semiconductor technology processes have a parasitic capacitance associated with them. Therefore, a larger resistor has a larger parasitic capacitance which leads to a reduction in bandwidth of the transimpedance amplifier.

Third, output potential drift of the transimpedance amplifier may be increased in some transimpedance amplifiers. For instance, some transimpedance amplifiers have an input stage including bipolar transistors which have specific tolerances and temperature dependence. In this situation, current through the feedback resistor creates a potential drift in the output voltage of the transimpedance amplifier that is proportional to the feedback resistor value. This drawback is especially prevalent in multistage transimpedance amplifiers with galvanic connection architecture.

Accordingly, there is a need in the art for a transimpedance amplifier having a feedback resistive network with a fixed effective resistance value for maintaining a high effective resistance value while improving on the above drawbacks.

BRIEF SUMMARY OF THE INVENTION

A transimpedance amplifier consistent with the invention includes a voltage amplifier having an input terminal and an output terminal, and a feedback circuit coupled to the input terminal and the output terminal of the voltage amplifier. The feedback circuit includes an impedance element in parallel with a feedback resistive network have a fixed effective resistive value.

An optical communication system consistent with the invention includes a light detector configured to detect an optical signal and produce a current signal representative of the optical signal, and a transimpedance amplifier configured to accept the current signal and provide a voltage signal representative of the current signal. The transimpedance amplifier includes a voltage amplifier having an input terminal and an output terminal, and a feedback circuit coupled to the input terminal and the output terminal of the voltage amplifier. The feedback circuit includes an impedance element in parallel with a feedback resistive network have a fixed effective resistive value.

Another transimpedance amplifier consistent with the invention includes a voltage amplifier having an input terminal and an output terminal, and a feedback resistive network having a fixed effective resistive value. The feedback resistive network is disposed between the input terminal and the output terminal of the voltage amplifier. The fixed effective resistive value is given by the equation: $Reff=R1+R2+R1(R2/R3)$, wherein Reff is the fixed effective resistive value; R1 is a resistance value of a first resistive element; R2 is a resistance value of a second resistive element; and R3 is a resistance value of a third resistive element.

According to yet a further aspect of the invention there is provided a transimpedance amplifier including a voltage amplifier having an input terminal and an output terminal, and a feedback resistive network having a fixed effective resistive value. The feedback resistive network is disposed between the input terminal and the output terminal of the voltage amplifier. The feedback resistive network includes a first resistive element disposed between the input terminal of the voltage amplifier and a node, a second resistive element disposed between the output terminal of the voltage amplifier and the node, and a third resistive element disposed between the node and a ground terminal.

There is also provided a method of increasing the bandwidth of a transimpedance amplifier that includes the steps of: providing a current signal to an input terminal of the transimpedance amplifier; providing an impedance element disposed between the input terminal and an output terminal of the transimpedance amplifier; and setting a fixed effective value for a feedback resistive network having an associated parasitic capacitance, the feedback resistive network disposed between the input terminal and an output terminal of the transimpedance amplifier in parallel with the impedance element, the bandwidth based on the associated parasitic capacitance of the feedback resistive network.

BRIEF DESCRIPTION OF THE DRAWINGS

Advantages of the present invention will be apparent from the following detailed description of exemplary embodiments thereof, which description should be considered in conjunction with the accompanying drawings, in which.

DETAILED DESCRIPTION

Figure 1:
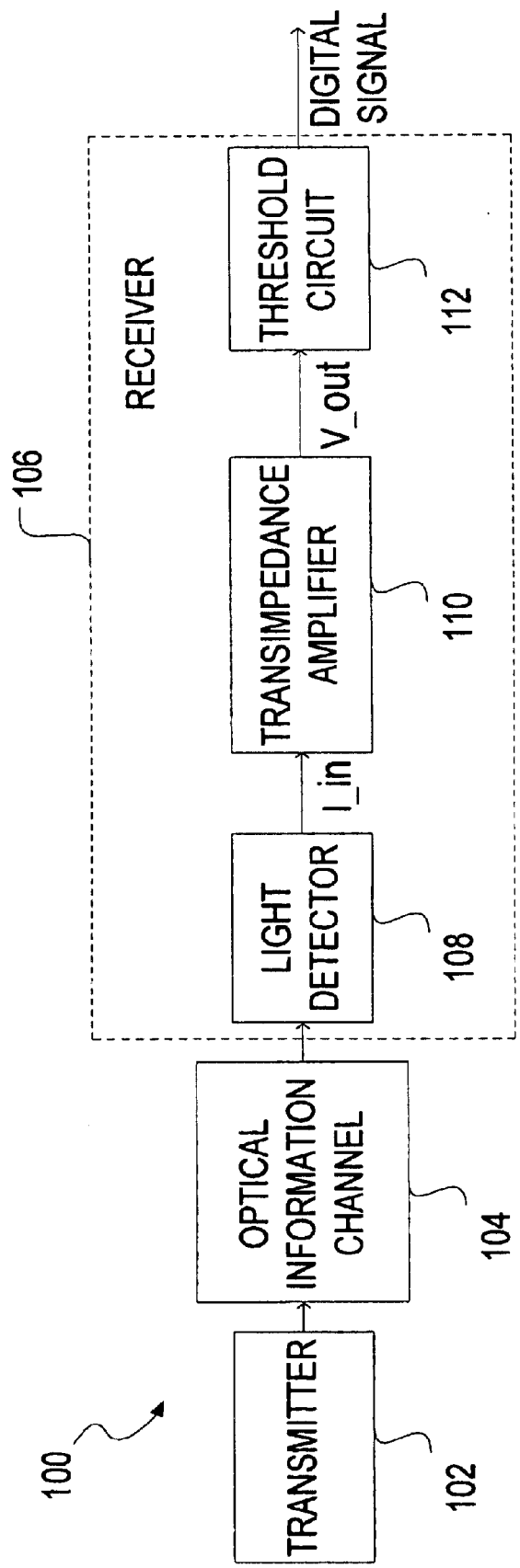
FIG. 1 is a block diagram of optical transmission system including a transimpedance amplifier consistent with the invention.

FIG. 1 is a block diagram of an optical communication system 100 including a transimpedance amplifier 110 consistent with the invention. The optical communication system 100 is one of a variety of systems or applications that may utilize a transimpedance amplifier 110 consistent with the invention. Other systems or applications include medical instruments, scientific instruments, low noise RF amplifiers, and RF signal processing applications, to name only several. Therefore, it is to be understood that a transimpedance amplifier consistent with the invention may be incorporated into a wide variety of systems or applications.

The optical communication system 100 generally includes a transmitter 102, optical information channel 104, and receiver 106. Those skilled in the art will recognize that the system 100 has been depicted as a highly simplified point-to-point system form for ease of explanation. It is to be understood that a receiver consistent with the invention may be further incorporated into a wide variety of optical network components and configurations.

At the transmitter 102, data may be modulated on an optical wavelength for transmission over the optical information channel 104. The optical information channel 104 may include an optical fiber waveguide, optical amplifiers, optical filters, dispersion compensating modules, and other active and passive components. The receiver 106 includes a light detector 108, e.g. a photodiode, which, in a known manner, converts received optical signals into associated current signals representative of the optical signals input to the light detector 108. In general, the transimpedance amplifier 110 is configured to receive the current signal I_in from the light detector 108 and convert it to a voltage signal V_out representative of the current signal.

The voltage signal V_out may then be input to a threshold circuit 112. The threshold circuit is configured to compare the received voltage signal with a threshold voltage level at an associated time. If the received signal is above the threshold level at the associated sample time, the threshold circuit 112 outputs a digital one. If the received signal is below the threshold level at the associated sample time, the threshold circuit outputs a digital zero. As such, a digital signal is output from the threshold circuit 112.

Figure 2:
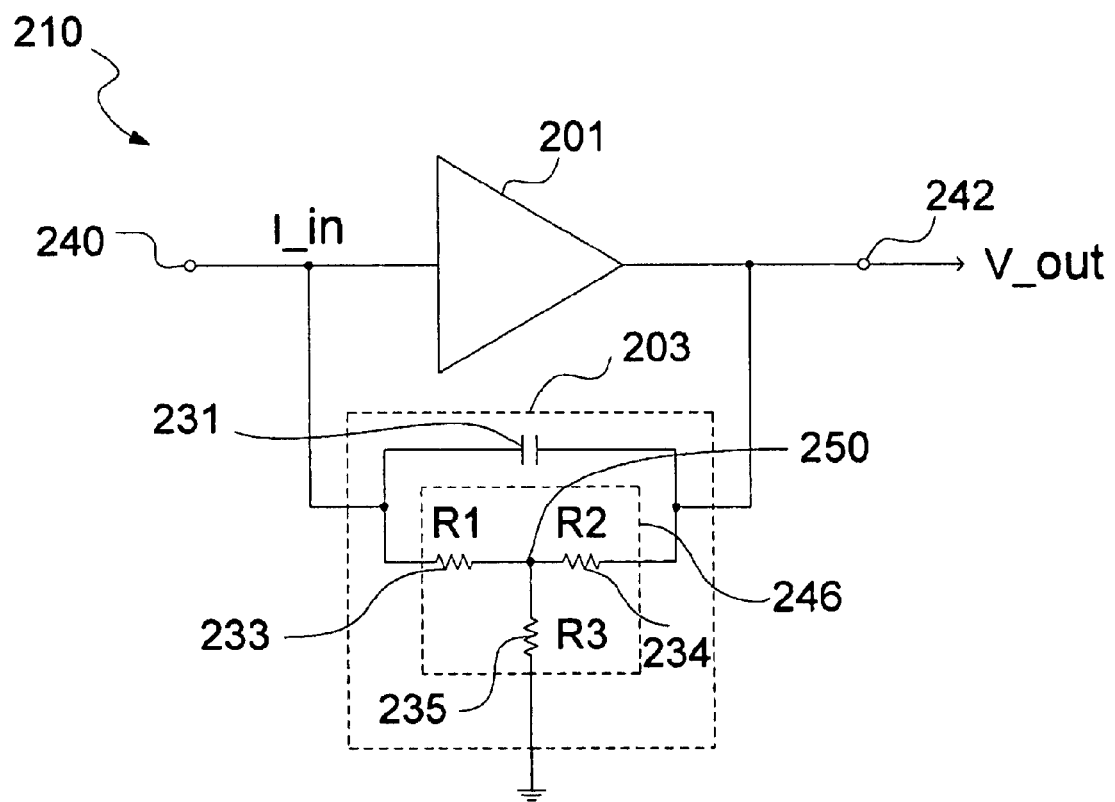
FIG. 2 is a more detailed diagram of the transimpedance amplifier of FIG. 1 having a feedback circuit consistent with invention.

Turning to FIG. 2, a block diagram of an exemplary transimpedance amplifier 210 consistent with the invention is illustrated. In general, the transimpedance amplifier 210 accepts an input current signal I_in and converts such signal to an output voltage signal V_out representative of the input current signal. The transimpedance amplifier 210 generally includes a voltage amplifier 201 having an input terminal 240 and output terminal 242. Coupled to the input terminal 240 and the output terminal 242 is a feedback circuit 203.

Advantageously, the feedback circuit 203 includes a feedback resistive network 246 as further detailed herein in parallel with an impedance element, e.g., a capacitor 231 in one embodiment. The impedance element provides frequency compensation for the transimpedance amplifier 210 at high frequencies. As such, the impedance element may have a frequency dependent conductivity and phase shift.

The feedback resistive network 246 may further include a plurality of resistive elements such as a first resistive element R1, a second resistive element R2, and a third resistive element R3. The resistive elements may be any variety of elements known in the art that have a resistive value, e.g., resistors manufactured by existing semiconductor technology processes. Such resistive elements may also be passive elements.

The first resistive element R1 may be disposed between the input terminal 240 of the voltage amplifier 201 and a node 250. The second resistive element R2 may be disposed between the output terminal 242 of the voltage amplifier 201 and the node 250. Finally, the third resistive element R3 may be disposed between the node 250 and ground. The first resistive element R1 and second resistive element R2 may be in series with each other. The effective resistance, Reff, of the feedback resistive network 246 is given be equation (1):

$$Reff=(R1+R2+R1(R2/R3))/1+(1+R2/R3)/K) \quad (1)$$

Since K, which is the modulus of the open loop voltage gain of the amplifier, is typically greater than 40, equation (1) may be simplified to equation (2):

$$Reff=R1+R2+R1(R2/R3) \quad (2)$$

As such, by choosing R3 small enough, the effective resistance can be high. In one of many examples, R1 and R2 may be 90.5 $\Omega$ and R3 may be 10 $\Omega$ resulting in Reff equal to 1 $\Omega$). Advantageously, the parasitic capacitance provided by R1, R2, and R3 is less than the parasitic capacitance provided by one large resistor having a resistor value equal to Reff. For example, the parasitic capacitance provided by R1, R2, and R3 if R1=R2=90.5 $\Omega$ and R3=10 $\Omega$ is less than the parasitic capacitance provided by a 1 $\Omega$ resistor.

As such, the bandwidth of the transimpedance amplifier is effectively increased. The feedback circuit 203 advantageously provides a high effective resistance that effectively increases the bandwidth of the transimpedance amplifier proportionately to the reduction in parasitic capacitance provided by the feedback resistive network 246. By proper selection of R1, R2, and R3, a desired bandwidth can be achieved.

Figure 3:
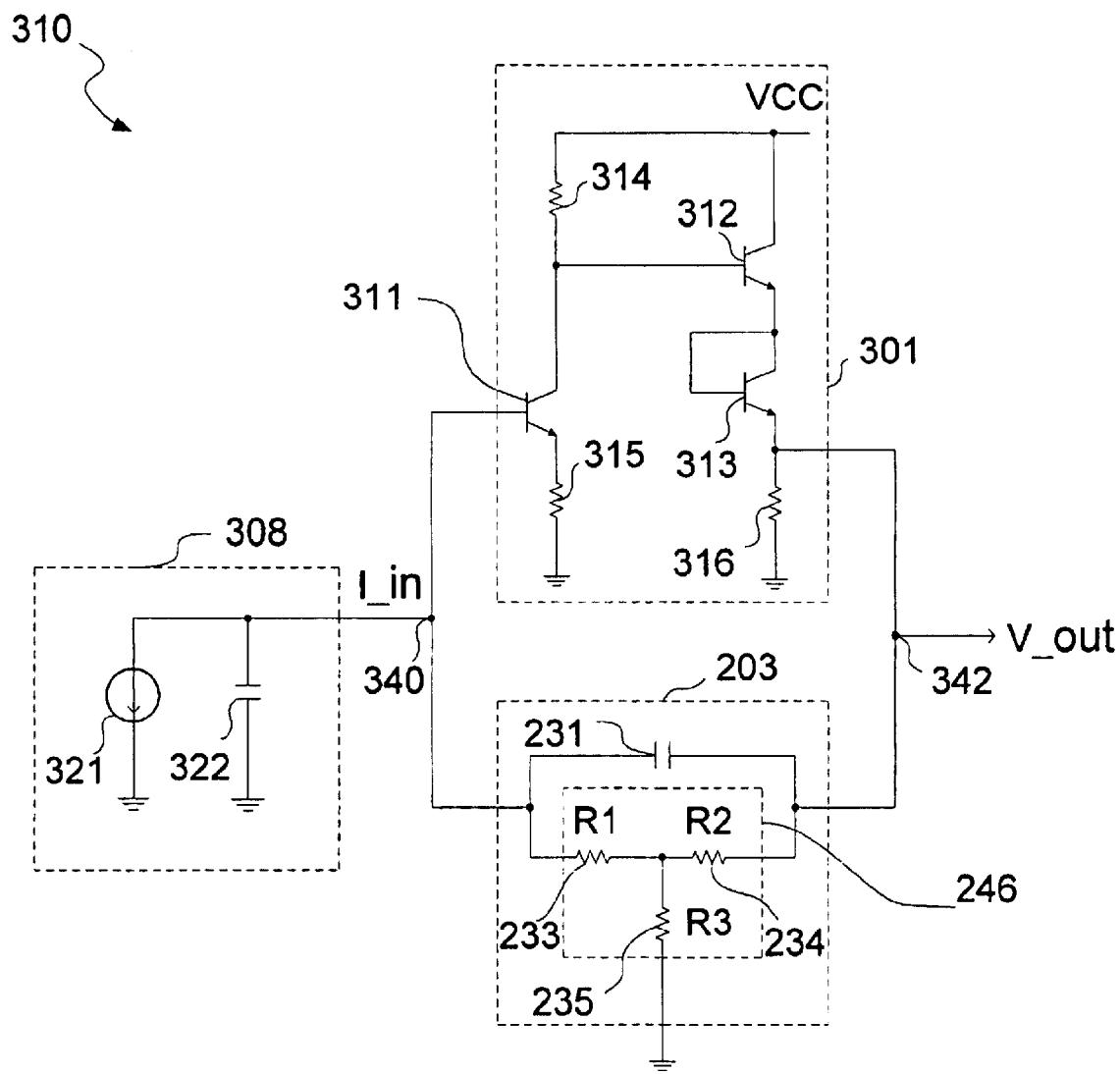
FIG. 3 is one exemplary circuit diagram of the transimpedance amplifier of FIG. 2.

Turning to FIG. 3, an exemplary circuit diagram for one embodiment of a transimpedance amplifier 310 consistent with the invention is illustrated. An input current source to the transimpedance amplifier 310 may be provided by a variety of sources such as a light detector 308. The light detector 308 may be a photodiode modeled as a current source 321 and a capacitor 322 as illustrated in FIG. 3. The transimpedance amplifier 310 includes the feedback circuit 203 including the feedback resistive network 246 in parallel with the impedance element, e.g., capacitor 231 as previously detailed. The feedback circuit is coupled to an input terminal 340 and an output terminal 342 of the voltage amplifier 301.

The voltage amplifier 301 of the transimpedance amplifier 310 includes transistors 311, 312, and 313 and resistors 314, 315, 316. The input current signal 1 in is coupled to the control electrode of transistor 311. In one embodiment, the transistors 311, 312, and 313 may be bipolar NPN type transistors. As such, the output terminal of bipolar transistor 313, or the emitter terminal of an NPN type transistor in one embodiment, may be coupled to an output terminal 342 of the transimpedance amplifier providing the output voltage signal V_out.

When the voltage amplifier 301 contains bipolar transistors, the output potential V_out may drift from a desired value. This output potential drift increases with a single larger feedback resistor. This drawback is especially prevalent in multistage transimpedance amplifiers with galvanic connection architecture. Advantageously, with a feedback circuit 203 consistent with the invention, the output potential drift may be reduced compared to use of a single larger feedback resistor. For instance in the embodiment of FIG. 3, as the transistor parameter P (beta) of bipolar transistors 311, 312,313 varies, e.g., between 50 and 200, under various conditions the output potential V_out only varied from about 1.03 times nominal output voltage to about 0.982 times nominal output voltage.

The embodiments that have been described herein, however, are but some of the several which utilize this invention and are set forth here by way of illustration but not of limitation. It is obvious that many other embodiments, which will be readily apparent to those skilled in the art, may be made without departing materially from the spirit and scope of the invention as defined in the appended claims.

What is claimed is:

1. A transimpedance amplifier comprising:
   a voltage amplifier having an input terminal and an output terminal; and
   a feedback circuit coupled to said input terminal and said output terminal of said voltage amplifier, said feedback circuit comprising an impedance element in parallel with a feedback resistive network having a fixed effective resistive value, said feedback resistive network comprising a first resistive element disposed between said input terminal of said voltage amplifier and a node, a second resistive element disposed between said output terminal of said voltage amplifier and said node, and a third resistive element disposed between said node and a ground terminal,
   wherein said fixed effective resistive value is given by the equation:

$$Reff = R1 + R2 + R1(R2/R3)$$

wherein R1 is a resistance value of said first resistive element; R2 is a resistance value of said second resistive element; and R3 is a resistance value of said third resistive element.

2. The transimpedance amplifier of claim 1, wherein said voltage amplifier comprises at least one bipolar transistor.

3. The transimpedance amplifier of claim 2, wherein said at least one bipolar transistor has a terminal coupled to said output terminal of said voltage amplifier.

4. The transimpedance amplifier of claim 1, wherein said impedance element comprises a capacitor.

5. The transimpedance amplifier of claim 1, wherein said first, second, and third resistive elements each comprise passive resistive element.

6. The transimpedance amplifier of claim 1, wherein said resistance value of said first resistive element is equal to said resistance value of said second element and said resistance value of said third resistive element is less than said resistance value of said first and said second resistive elements.

7. The transimpedance amplifier of claim 6, wherein said resistance value of said first and second resistive element is 90.5 Ω and said resistance value of said third resistive element is 10 Ω.

8. An optical communication system comprising:
   a light detector configured to detect an optical signal and produce a current signal representative of said optical signal; and
   a transimpedance amplifier configured to accept said current signal and provide a voltage signal representative of said current signal, said transimpedance amplifier comprising:
   a voltage amplifier having an input terminal and an output terminal; and
   a feedback circuit coupled to said input terminal and said output terminal of said voltage amplifier, said feedback circuit comprising an impedance element in parallel with a feedback resistive network having a fixed effective resistive value, wherein said feedback resistive network comprises a first resistive element disposed between said input terminal of said voltage amplifier and a node, a second resistive element disposed between said output terminal of said voltage amplifier and said node, and a third resistive element disposed between said node and a ground terminal
   wherein said fixed effective resistive value is given by the equation:

$$Reff = R1 + R2 + R1(R2/R3)$$

wherein R1 is a resistance value of said first resistive element; R2 is a resistance value of said second resistive element; and R3 is a resistance value of said third resistive element.

9. The system of claim 8, wherein said voltage amplifier comprises at least one bipolar transistor.

10. The system of claim 9, wherein said at least one bipolar transistor has a terminal coupled to said output terminal of said voltage amplifier.

11. The system of claim 8, wherein said impedance element comprises a capacitor.

12. The system of claim 8, wherein said first, second, and third resistive elements each comprise passive resistive elements.

13. The system of claim 8, wherein said resistance value of said first resistive element is equal to said resistance value of said second element and said resistance value of said third resistive element is less than said resistance value of said first and said second resistive elements.

14. The system of claim 13, where in said resistance value of said first and second resistive element is 90.5 Ω and said resistance value of said third resistive element is 10 Ω.

15. A transimpedance amplifier comprising:
   a voltage amplifier having an input terminal and an output terminal; and
   a feedback resistive network having a fixed effective resistive value, said feedback resistive network disposed between said input terminal and said output terminal of said voltage amplifier, said fixed effective resistive value given by the equation:

$$Reff = R1 + R2 + R1(R2/R3)$$

wherein Reff is said fixed effective resistive value; R1 is a resistance value of a first resistive element; R2 is a resistance value of a second resistive element; and R3 is a resistance value of a third resistive element.

16. A method of increasing the bandwidth of a transimpedance amplifier comprising the steps of:
   providing a current signal to an input terminal of said transimpedance amplifier;
   providing impedance element disposed between said input terminal and an output terminal of said transimpedance amplifier; and
   setting a fixed effective value for a feedback resistive network having an associated parasitic capacitance, said feedback resistive network disposed between said input terminal and an output terminal of said transimpedance amplifier in parallel with said impedance element, said bandwidth based on said associated parasitic capacitance of said feedback resistive network, said feedback network comprising a first resistive element disposed between said input terminal of said voltage amplifier and a node, a second resistive element disposed between said output terminal of said voltage amplifier and said node, and a third resistive element disposed between said node and a ground terminal,
   wherein said fixed effective resistive value is given by the equation:

$$Reff = R1 + R2 + R1(R2/R3)$$

wherein R1 is a resistance value of said first resistive element; R2 is a resistance value of said second resistive element; and R3 is a resistance value of said third resistive element.

* * * * *